(12) United States Patent
Grossmann et al.

(10) Patent No.: US 11,972,193 B1
(45) Date of Patent: Apr. 30, 2024

(54) AUTOMATIC ELASTIC CPU FOR PHYSICAL VERIFICATION

(71) Applicant: Synopsys, Inc., Mountain View, CA (US)

(72) Inventors: Chris Allen Grossmann, Raleigh, NC (US); Sumit Bhagwanani, Bellevue, WA (US); Mark Daniel Pogers, Wake Forest, NC (US)

(73) Assignee: SYNOPSYS, INC., Sunnyvale, CA (US)

( * ) Notice: Subject to any disclaimer, the term of this patent is extended or adjusted under 35 U.S.C. 154(b) by 240 days.

(21) Appl. No.: 17/490,585

(22) Filed: Sep. 30, 2021

Related U.S. Application Data (60) Provisional application No. 63/086,430, filed on Oct. 1, 2020.

(51) Int. Cl.
*G06F 30/398* (2020.01)
*G06F 11/34* (2006.01)
*G06F 30/27* (2020.01)

(52) U.S. Cl.
CPC ........ *G06F 30/398* (2020.01); *G06F 11/3442* (2013.01); *G06F 30/27* (2020.01)

(58) Field of Classification Search
CPC ..... G06F 30/398; G06F 11/3442; G06F 30/27
See application file for complete search history.

(56) References Cited

U.S. PATENT DOCUMENTS

| | | | | |
|---|---|---|---|---|
| 10,783,291 | B2* | 9/2020 | Todd | G06F 30/39 |
| 10,944,814 | B1* | 3/2021 | Virtuoso | H04L 47/803 |
| 11,030,009 | B2* | 6/2021 | Gonzalez | G06F 9/5022 |
| 11,036,906 | B1* | 6/2021 | Chhabra | G06F 30/398 |
| 11,409,552 | B2* | 8/2022 | Medina | G06F 9/5044 |
| 2008/0077891 | A1* | 3/2008 | Dooling | G06F 30/398 |
| | | | | 716/52 |
| 2019/0146847 | A1* | 5/2019 | Gibson | G06F 9/5011 |
| | | | | 718/104 |
| 2019/0347138 | A1* | 11/2019 | Gibson | H04L 67/562 |
| 2020/0218788 | A1* | 7/2020 | Todd | G06F 30/39 |
| 2021/0081509 | A1* | 3/2021 | Salik | G06T 7/0004 |
| 2021/0374319 | A1* | 12/2021 | Gibson | G06F 9/5083 |
| 2022/0116455 | A1* | 4/2022 | Raghunath | H04L 41/5025 |
| 2023/0305838 | A1* | 9/2023 | Chandrasekaran | |
| | | | | G06F 11/3442 |
| | | | | 717/102 |

* cited by examiner

*Primary Examiner* — Nha T Nguyen
(74) *Attorney, Agent, or Firm* — Lewis Roca Rothgerber Christie LLP

(57) ABSTRACT

Disclosed herein are a method, a system, and a computer-readable storage-medium embodiments of automatic elastic CPU for a physical verification job. An embodiment includes generating multiple commands for a physical verification job of a design. The multiple commands are related by a dependency graph. The embodiment further includes allocating an initial amount of computing resources to execute the multiple commands, queuing a subset of the multiple commands for execution based on the dependency graph, adding an estimated amount of computing resources to the initial amount based on the number of the queued subset of commands and an estimated time to complete the queued subset of commands, and releasing a portion of the estimated amount of computing resources in response to the portion of the estimated amount of computing resources being idle for an amount of time greater than a target time.

20 Claims, 6 Drawing Sheets

AUTOMATIC ELASTIC CPU FOR PHYSICAL VERIFICATION

CROSS-REFERENCE TO RELATED APPLICATIONS

The present application claims the benefit of U.S. Provisional Patent Application No. 63/086,430, titled "Automatic Elastic CPU for Physical Verification," filed on Oct. 1, 2020, which is incorporated by reference in its entirety for all purposes.

TECHNICAL FIELD

The present disclosure generally relates to an electronic design application (EDA) system. In particular, the present disclosure relates to a system and method for providing an automatic elastic central processing unit (CPU) for processing physical verification of a design.

BACKGROUND

The continuous development of integrated circuits (IC) in advanced semiconductor technology creates challenges for physical verification of an IC design. Physical verification is a process where an electronic design automation (EDA) system verifies the IC design to ensure correct electrical and logical functionality and manufacturability of the IC design. The EDA system can include a physical verification system to verify the IC design through design rule check (DRC), layout versus schematic (LVS), fill, electrical rule check (ERC), and other suitable verification checks. The physical verification systems can perform physical verification checks using computing resources across multiple processors and multiple network hosts. For IC designs of advanced technology nodes, design sizes are increasing and design rules are more numerous and more complex, which requires additional computing resources to satisfy runtime and tape out schedules for the IC designs.

SUMMARY

This disclosure describes a method for providing an automatic elastic CPU for physical verification. The method includes generating multiple commands for a physical verification job of a design. The multiple commands are related by a dependency graph. The method further includes allocating an initial amount of computing resources to execute the multiple commands, queuing a subset of the multiple commands for execution based on the dependency graph, adding an estimated amount of computing resources to the initial amount based on the number of the queued subset of commands and an estimated time to complete the queued subset of commands, and releasing a portion of the estimated amount of computing resources in response to the portion of the estimated amount of computing resources being idle for an amount of time greater than a target time. The estimated time is determined according to one or more of a length and a number of input layers of each command in the queued subset of commands This disclosure also describes a system to provide an automatic elastic CPU for physical verification. The system includes a memory storing instructions and at least one processor coupled with the memory to execute the instructions. The instructions when executed cause the processor to generate multiple commands for a physical verification job of a design. The multiple commands are related by a dependency graph. The instructions when executed further cause the at least one processor to allocate an initial amount of computing resources to execute the multiple commands, queue a subset of the multiple commands for execution based on the dependency graph, add an estimated amount of computing resources to the initial amount based on the number of the queued subset of commands and an estimated time to complete the queued subset of commands, and release a portion of the estimated amount of computing resources in response to the portion of the estimated amount of computing resources being idle for an amount of time greater than a target time. The estimated time is determined according to one or more of a length and a number of input layers of each command in the queued subset of commands.

This disclosure also describes a non-transitory computer readable medium comprising stored instructions to provide an automatic elastic CPU for physical verification. The instructions, when executed by at least one processor, cause the at least one processor to generate multiple commands for a physical verification job of a design. The multiple commands are related by a dependency graph. The instructions when executed further cause the at least one processor to allocate an initial amount of computing resources to execute the multiple commands, queue a subset of the multiple commands for execution based on the dependency graph, add an estimated amount of computing resources to the initial amount based on the number of the queued subset of commands and an estimated time to complete the queued subset of commands, and release a portion of the estimated amount of computing resources in response to the portion of the estimated amount of computing resources being idle for an amount of time greater than a target time. The estimated time is determined according to one or more of a length and a number of input layers of each command in the queued subset of commands

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a system and method for providing an automatic elastic CPU for physical verification. A physical verification system can automatically add and remove computing resources (e.g., CPUs) during physical verification of a design to provide automatic elastic CPU for the physical verification. The automatic elastic CPU is so termed because it can automatically change an amount of the computing resources used by the physical verification system during the process of physical verification through automatically adding and removing computing resources to provide elastic computing capacity.

With the development of IC technology, design sizes are increasing and design rules are becoming more complex. This additional complexity requires additional computing resources to satisfy the runtime for physical verification of the IC designs and the tapeout schedules of the IC designs. Runtime can be an amount of time to complete a physical verification job of a design. According to the size of the design and the rules of the design, the physical verification job of the design can be divided into a large number of work items (also referred to as "commands") to check various parts of the design.

The large number of commands can have a dependency graph describing the dependency between the commands. To reduce the runtime of the physical verification job, physical verification systems can spread the large number of commands of the physical verification job not only across multiple CPUs on a single physical computing host, but also across multiple networked hosts. A physical verification system can verify a chip design of a particular semiconductor technology node, for example, for about twenty hours using four hosts, each with sixteen CPUs.

Physical verification systems are scalable to add more resources to speed up the physical verification job. However, the large number of commands can have a complex dependency graph due to the non-homogeneity of the complexity of the design rules and the unpredictability of the interaction between the physical verification checks and the design data. The amount of time for a physical verification system to complete a command and the number of dependent commands for the command can vary significantly and can be difficult to predict. Some parts of the physical verification job can have a large number of independent commands that can be executed in parallel. Some parts of the physical verification job can have a single command having a large number of dependent commands and holding up the execution of the dependent commands. As a result, it can be difficult for the user to determine how many computing resources to allocate for the physical verification job.

If the user does not allocate enough computing resources, the physical verification job may take a longer time to complete. Excessive runtime for the physical verification job can cause loss to the user. The time that is used for waiting for completion of the physical verification job cannot be used for debugging the results of the physical verification job. As a result, a shorter time to complete the physical verification job is desired.

If the user specifies more computing resources than needed, the physical verification job may be limited by a single command or a small number of commands, and some of the computing resources may be idle and not available for other users or other jobs. Idling of the computing resources can lead to a waste of computing resources by over-reserving and under-utilizing of the computing resources. The waste of computing resources can result in loss to the user.

For example, in a cloud environment with cloud computing resources, users can end up paying by-minute rates for the reserved cloud computing resources that are not used. For an on-premise environment with local computing resources, some of the local computing resources reserved for a physical verification job can be idle and may not be used by other users or other jobs, which can lead to purchase of additional computing resources for the other users and the other jobs. In addition, software licenses can be occupied when additional computing resources are added to the physical verification job. The idle computing resources can take up software licenses that could be used for other jobs.

As a result, to complete a physical verification job of a design, a user may not be able to determine an amount of computing resources to both minimize the runtime for the physical verification job and reduce the usage of computing resources for the physical verification job. The use can add additional computing resources with a physical verification system to speed up the physical verification job and reduce the runtime. However, the dependency relationships of the commands in the physical verification job can be complex. The details of the causes and cures to the complexity of the large number of commands may be not available to the user. Additional knowledge may be required for not only the design rules and the way the design rules are implemented in the design, but also the way how the design rules interact with the design data.

This disclosure relates to running a physical verification job on multiple hosts and describes a method to automate the process of adding computing resources and removing computing resources during the physical verification job. This disclosure allows the physical verification system to add and remove computing resources based on real-time information of the commands of the physical verification job and the computing resources allocated for the physical verification job. In some embodiments, the physical verification system can automatically add additional computing resources for queued commands. In some embodiments, the physical verification system can automatically remove idle computing resources to reduce cost. Various embodiments in the disclosure can automate the management of the computing resources by the physical verification system to optimize the runtime of completing the physical verification job and the usage of the computing resources.

A physical verification system can perform operations (e.g., design rule check (DRC), layout versus schematic (LVS), and fill) defined by a foundry in a foundry-specified runset language (e.g., a proprietary programmable extensible runset language (PXL)) on a binary-format customer database (for example, e.g., graphic design system (GDS), open artwork system interchange standard (OASIS)). The runset is a set of instructions that scan and process physical design shapes with the purpose of detecting violations of design rules for a specific fabrication technology.

The customer database can include a mask description of a stack of layers to be fabricated when creating the chip design on a wafer. The customer database can be created as the end-process of the implementation system. The design data of the chip design can be streamed out of a circuit design implementation system or a layout implementation system into the customer database in binary format. The stack of layers in the chip design can be represented by a design hierarchy of cells. In some embodiments, the chip design can have hundreds of layers. Accordingly, the design hierarchy can have hundreds of cells with about a dozen of hierarchy levels. The design data in the customer database can represent the physical data of the cells. As a result, the design data is subject to foundry checks to perform physical verification on the chip design.

A physical verification job of a design can include thousands of checks and each check can include various numbers of work items or commands. In some embodiments, each check can include about several dozens of commands. Each command can take one or more inputs. In some embodiments, the inputs can include layers corresponding to the physical layers in the customer design database. The commands can perform work on the inputs, such as manipulating the physical layers and generating one or more output layers. The checks can include geometric measurements of a single layer, geometric comparisons between multiple layers, and complicated comparisons between subsets of layers. The checks and the commands in the checks are supplied by the foundry as a "runset." The runset is written in a language appropriate for the physical verification tool. For example, the PXL language is used for the runset for a physical verification system such as IC Validator.

In some embodiments, the total number of units of work items in a physical verification job can be the same as the total number of commands and the work items can be referred to as "commands." In some embodiments, due to complexities in optimizing both the input customer database and the runset, the total number of units of work items in the physical verification job can be different from the total number of commands while the work items can also be referred to as "commands."

Figure 1:
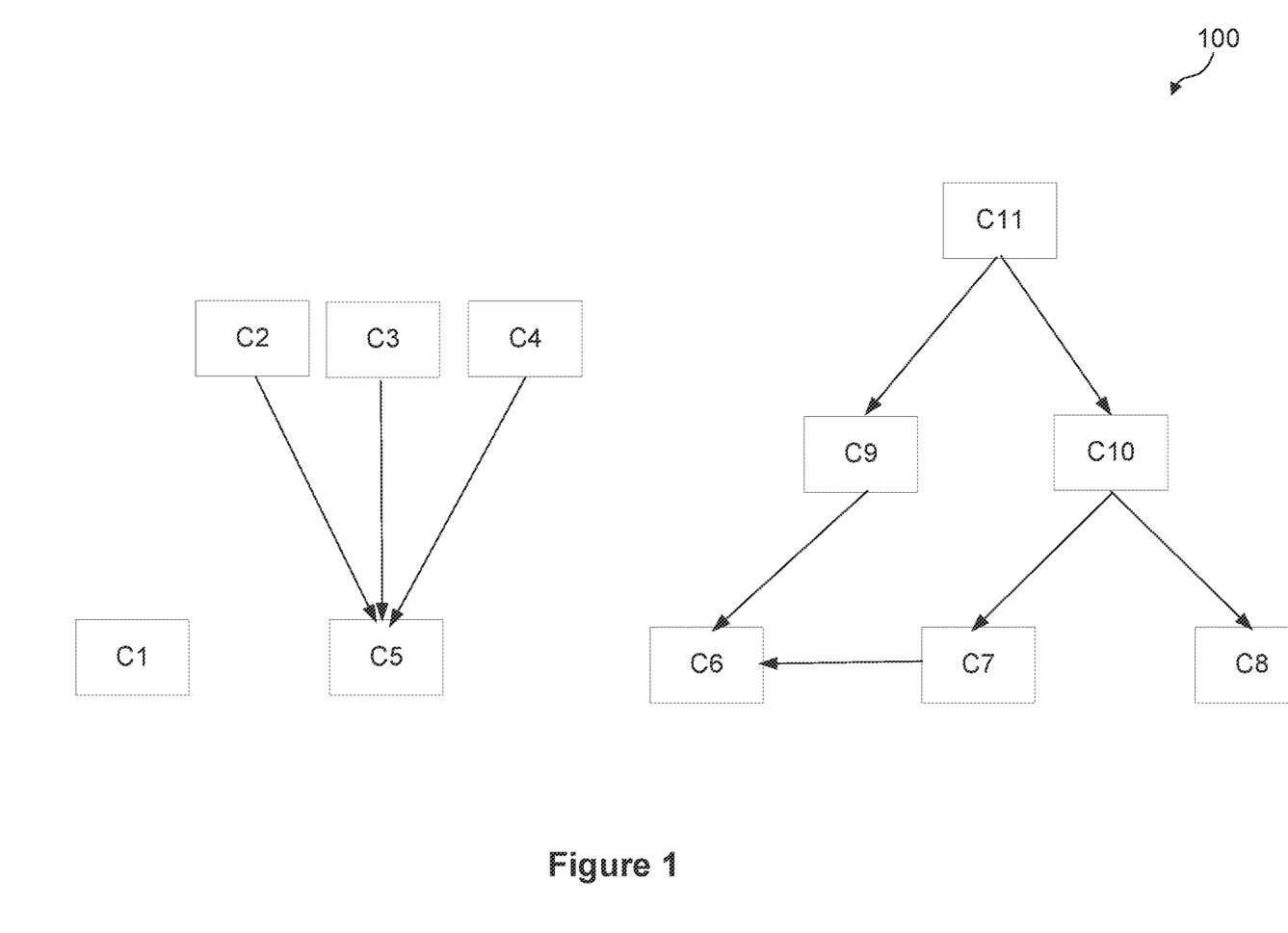
FIG. 1 illustrates a dependency graph of commands for a physical verification job of a design, according to some embodiments of the present disclosure.

A physical verification job can include a large number of commands, for example, tens of thousands of commands. A dependency graph can describe the relationships between the commands of the physical verification job. FIG. 1 illustrates a dependency graph 100 of commands for a physical verification job of a design, according to some embodiments of the present disclosure. In some embodiments, some commands of the physical verification job are independent, such as command C1 in FIG. 1. Independent commands can be executed before or after the other commands. In some embodiments, some commands of the physical verification job are dependent, such as commands C2-C11 in FIG. 1. For dependent commands, the output of a command can be an input of another command. For example, as shown in FIG. 1, command C6 is dependent on commands C7 and C9, which are each further dependent on C10 and C11, respectively. As a result, the commands of the physical verification job can have a complex dependency graph.

In some embodiments, an individual command can perform a geometric operation to transform a number of input layers into a new output layer. In some embodiments, the geometric operation can be a boolean operation. For example, as shown in FIG. 1, command C1 can be LAYER3=LAYER1 AND LAYER2, where command C1 creates a new LAYER3 having a design shape generated from the design shapes on both LAYER1 and LAYER2. In some embodiments, the geometric operation can be a detailed check that depends on connectivity through the entire stack of layers in the design. For example, command C2 can be CONNECT LAYER1 LAYER2 to electrically connect LAYER1 and LAYER2, command C3 can be CONNECT LAYER3 LAYER4 to electrically connect LAYER3 and LAYER4, command C4 can be CONNECT LAYER5 LAYER6 to electrically connect LAYER5 and LAYER6, and command C5 can be CONNECT LAYER1 LAYER2 LAYER3 LAYER4 LAYER5 LAYER6 to electrically connect LAYER1-LAYER6. The runtime of a command can be related to the complexity of the geometric operation of the command and the size (e.g., the number of inputs) of the input layers. As shown in FIG. 1, the runtime of command C5 and the runtime of command C6 can be greater than the runtime of command C1.

A sequence of dependent commands can be referred to as a command chain. The dependent commands in a command chain can be executed in a serial order according to the dependency in the command chain. For example, as shown in FIG. 1, commands C6, C7, C9, C10, and C11 can be a commanded chain and need to be executed in a serial order. In some embodiments, the dependent command that depends on other commands in the command chain can be referred to as a child command. The command in the command chain that other commands depend on can be referred to as a parent command. For example, as shown in FIG. 1, command C11 is a parent command of commands C9 and C10, which are parent commands for commands C6 and C7, respectively. In some embodiments, a shorter command chain (e.g., commands C2-C5) can be scheduled for execution more easily than a longer command chain (e.g., commands C6-C11). The longer command chain (e.g., commands C6-C11) can limit the runtime of the physical verification job.

A physical verification system can build a dependency graph (e.g., dependency graph 100 in FIG. 1) for the commands of a physical verification job and can include a scheduler scheduling the commands for execution according to the dependency graph. In some embodiments, one host can have multiple CPUs. The scheduler in the physical verification system can determine how to allocate CPUs across multiple hosts for the physical verification job. The physical verification system can execute the commands using multiple processes on one host, multiple threads on one process, or a combination thereof. Each individual work item or command can be executed in multiple threads but may not be executed in more than one process.

The runtime of the commands can vary between each other. For example, some commands (e.g., command C1 in FIG. 1) can take several seconds to execute while some commands (e.g., command C6 in FIG. 1) can take several days. Though the physical verification system can estimate the runtime of an individual command, the actual runtime of the individual command can depend on interactions of various factors during execution, for example, hierarchical interactions between design shapes. In some embodiments, the cells in a chip design can include placements of polygons and/or additional cells. The physical verification job can verify each cell of the chip design based on the hierarchical interactions of the polygons between different cells. For example, in command C1, the design shapes or polygons of components in LAYER3 may depend on the design shapes or polygons of components in LAYER1 and LAYER2. The polygons in LAYER3 can interact with polygons in LAYER1 and LAYER2, such as merging with polygons in LAYER1 and LAYER2, and the polygons in LAYER1 and LAYER2 can further interact with polygons of other cells in another hierarchical level. As a result, the actual runtime to verify the design shapes in LAYER3 may change from the estimated runtime due to the hierarchical interactions between design shapes of different hierarchical levels.

At the beginning of a physical verification job, a user may allocate an amount of computing resources, such as hosts and CPUs, with a physical verification system to perform the physical verification job. If the user does not specify enough computing resources, the physical verification job may take a longer time and may hold up other commands (e.g., dependent commands in a command chain) or other jobs. If the user specifies more computing resources than actually needed, idle computing resources and licenses can increase the cost to perform the physical verification job. The user may add computing resources to the physical verification job during execution to speed up the physical verification job or remove idle computing resources to reduce the waste of computing resources. However, management of computing resources by the use during execution of the physical verification job can require excessive user interactions and diligences.

Figure 2:
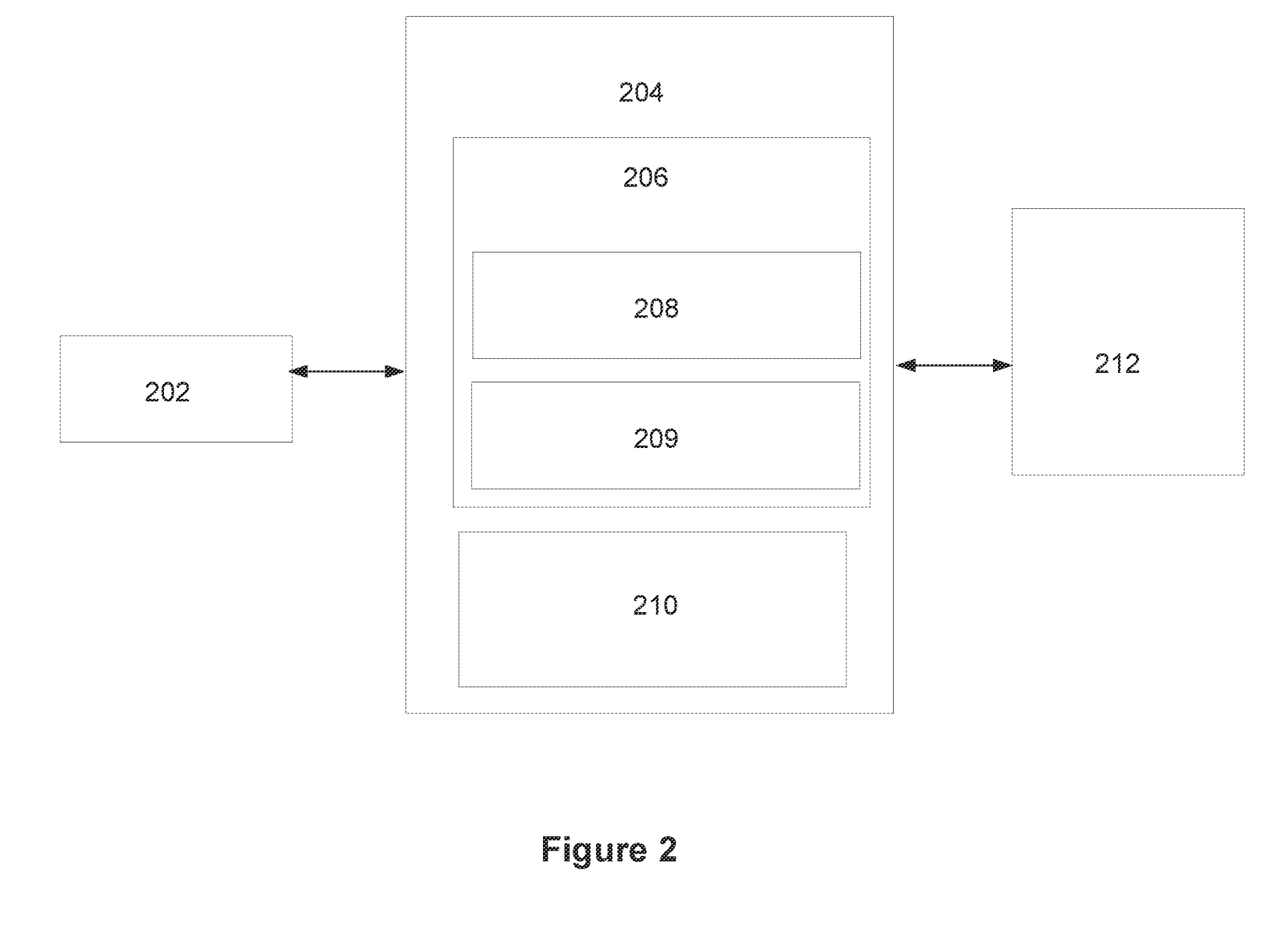
FIG. 2 illustrates an architectural diagram for a physical verification system to perform a physical verification job of a design, according to some embodiments of the present disclosure.
Figure 6:
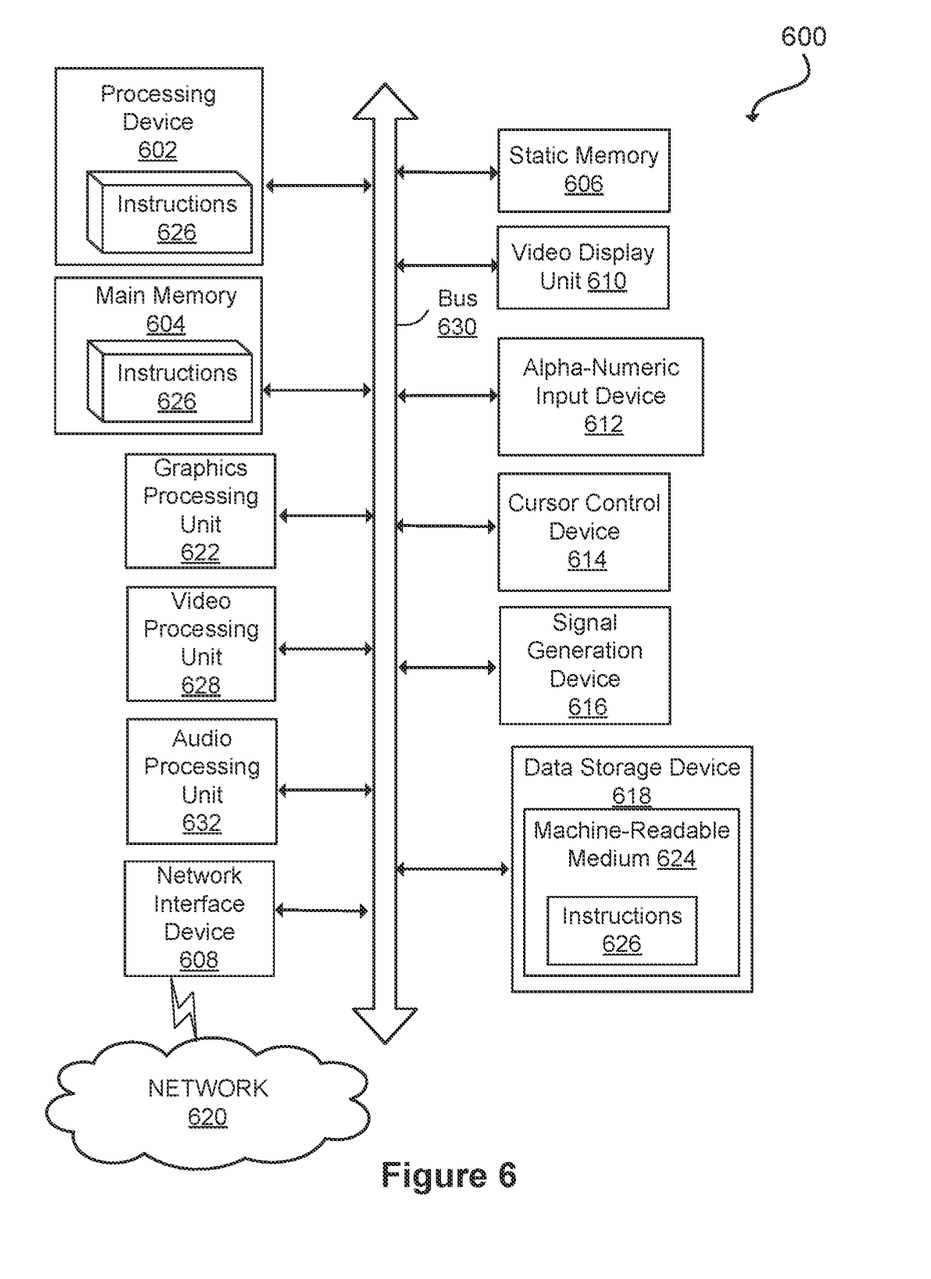
FIG. 6 depicts a diagram of an example computer system in which embodiments of the present disclosure may operate.

FIG. 2 illustrates an architectural diagram for a physical verification system to perform a physical verification job of a design, according to some embodiments of the present disclosure. As shown in FIG. 2, customer database 202 provides a runset of a design to physical verification system 204. Physical verification system 204 can divide the physical verification job of the design into a number of commands related by a dependency graph, such as dependency graph 100 in FIG. 1. Physical verification system 204 can include scheduler 206 and reservation system 210. Scheduler 206 in physical verification system 204 can add a subset of the commands for the physical verification job into queued commands 208 for execution by computing resources 212. Scheduler 206 can generate acquisition commands 209 to add or remove computing resources in computing resources 212 based on the commands in queued commands 208. Reservation system 210 can keep track of reserved computing resources 212. In some embodiments, scheduler 206 and reservation system 210 can be components of physical verification system 204 implemented by a processor, such as processing device 602 in computer system 600. Instructions of scheduler 206 can be processed by processing device 602 and reservation system 210 can store information of reserved computing resources 212 in main memory 604 and data storage device 618 of computing system 600. In some embodiments, computing resources 212 can include local computing resources, such as hosts and CPUs, and cloud computing resources, such as cloud virtual machines. Scheduler 206 can keep track of the dependency graph of the commands, the executed commands of the physical verification job, and queued commands 208 to be executed. If a command of the physical verification job does not depend on other commands, or other commands that the command depends on are executed, the command can enter queued commands 208. After the command is added to queued commands 208, scheduler 206 can allocate computing resources 212 to execute the commands in queued commands 208.

The number of queued commands 208 can change during execution of the physical verification job. If the number of queued commands 208 increases, physical verification system 204 can acquire more resources from computing resources 212 to reduce the runtime of the physical verification job. If the number of queued commands 208 decreases to zero, physical verification system 204 may not acquire any resources from computing resources 212 for the physical verification job. For example, a command with a long command chain having multiple dependencies can take a long time to complete and can hold up multiple dependent commands, which can lead to a large number of idle computing resources.

Figure 3:
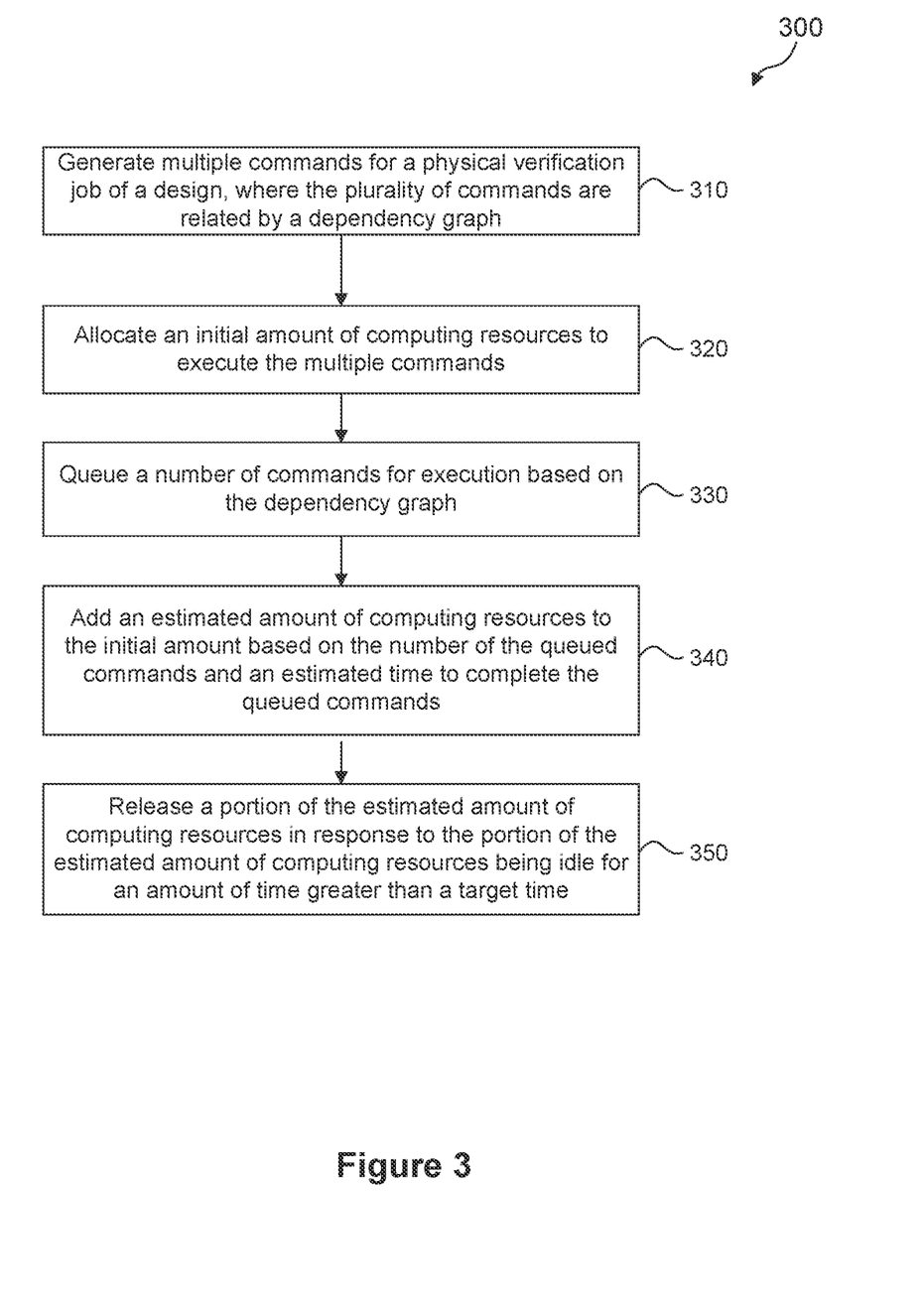
FIG. 3 illustrates a flowchart of a method for providing automatic elastic CPU for physical verification of a design, according to some embodiments of the present disclosure.

FIG. 3 illustrates a flowchart of a method 300 for providing automatic elastic CPU for physical verification of a design, according to some embodiments of the present disclosure. Additional operations may be performed between various operations of method 300 and may be omitted merely for clarity and ease of description. Additionally, some of the operations may be performed simultaneously, or in a different order than the ones shown in FIG. 3. Accordingly, it is understood that additional processes can be provided before, during, and/or after method 300, and that these additional processes can be briefly described herein. For illustrative purposes, the operations illustrated in FIG. 3 can be described with reference to FIGS. 1, 2, and 4.

Referring to FIG. 3, at 310, multiple commands are generated for a physical verification job of a design. The multiple commands are related by a dependency graph. For example, as shown in FIG. 1, commands C1-C11 can be generated for a physical verification job to check a design. A runset of the design can be provided to physical verification system 204 from customer database 202. Commands C1-C11 can be related by dependency graph 100. In some embodiments, a physical verification job of a design can include thousands of checks to process physical design shapes and detect violation of design rules in the design. Each check can include a number of commands to perform manipulations of physical layers in the design. One command in the physical verification job can depend on other commands and can be related by a dependency graph, such as dependency graph 100.

Referring to FIG. 3, at 320, an initial amount of computing resources is allocated to execute the multiple commands. For example, as shown in FIG. 2, physical verification system 204 can allocate an initial amount of computing resources 212 to the physical verification job. In some embodiments, the initial amount of computing resources can be allocated based on the number of commands in physical verification job and an available amount of computing resources 212. For example, physical verification system 204 can allocate one host for the physical verification job at the beginning of the physical verification job. In some embodiments, the initial amount of computing resources can be allocated based on a subset of the multiple commands in the physical verification job, for example, independent commands of the multiple commands. In some embodiments, the initial amount of computing resources can be a default value specified by a user at the beginning of the physical verification job.

Referring to FIG. 3, at 330, a subset of the multiple commands are queued for execution based on the dependency graph. For example, as shown in FIG. 2, physical verification system 204 can add commands in the physical verification job to queued commands 208 based on the dependency graph of the commands. For example, physical verification system 204 can add commands C1, C2, C3, C4, and C11 in FIG. 1 based on dependency graph 100 to queued commands 208. The commands of the physical verification job can be executed according to dependency graph 100. Independent commands (e.g., command C1) and parent commands (e.g., commands C2, C3, C4, and C11) that have child or dependent commands can be queued and executed before the dependent commands (e.g., commands C6-C10).

Referring to FIG. 3, at 340, an estimated amount of computing resources is added to the initial amount of computing resources based on the number of queued subset of commands and an estimated time to complete the queued subset of commands. For example, as shown in FIGS. 1 and 2, physical verification system 204 can determine the estimated amount of computing resources based on the number of commands in queued commands 208 and the estimated time to complete queued commands 208 during the process of the physical verification job. When the commands in queued commands 208 are executed, physical verification system 204 can add additional commands to queued commands 208 based on dependency graph 100. For example, as shown in FIGS. 1 and 2, after command C11 is executed, physical verification system 204 can add commands C9 and C10 to queued commands 208. Physical verification system 204 can evaluate queued commands 208 in real-time and estimate additional computing resources needed for queued commands 208. For example, if the number of queued commands 208 is greater than a target number for a period of time, physical verification system 204 can add the estimated amount of computing resources to computing resources 212 for the physical verification job to speed up the process and reduce the runtime.

In some embodiments, at the beginning of the physical verification job, the user can specify mechanisms for physical verification system 204 to acquire computing resources 212. In some embodiments, physical verification system 204 can determine the mechanisms to acquire computing resources 212 based on the commands in the physical verification job. The mechanisms can include parameters such as the number of CPUs to be used, the memory on a host to be used, and other relevant parameters. These parameters can be default values set by the user or initial values determined by physical verification system 204. The default or initial values of the parameters in physical verification system 204 can serve as a start point to perform the physical verification job. The values of the parameters can be refined through further heuristics during the process of physical verification job. Physical verification system 204 can add or remove computing resources 212 to the physical verification job and update the values of the parameters.

In some embodiments, physical verification system 204 can have the information of dependency graph 100, computing resources 212 allocated for the physical verification job, and queued commands 208. Physical verification system 204 can use this information to determine whether additional computing resources are needed to reduce the runtime of the physical verification job.

In some embodiments, physical verification system 204 can acquire additional computing resources 212 based on the system performing the physical verification job. For example, for a batch queueing system, such as Load Sharing Facility (LSF®) and Univa Grid Engine (UGE®), physical verification system 204 can generate corresponding acquisition commands 209 to acquire the additional computing resources 212. After acquiring the additional computing resources, physical verification system 204 can provide an additional command to connect back to the physical verification job. In some embodiments, in a cloud computing system, the physical verification system can perform a network operation to create a virtual machine or acquire a virtual machine from the cloud computing system for computing resources 212. In some embodiments, physical verification system 204 can determine whether to add additional computing resources and can acquire the additional computing resources 212 without user interaction.

In some embodiments, the parameters for physical verification system 204 to acquire additional computing resources 212 can include the number of the queued subset of commands and related information of the queued subset of commands. For example, as shown in FIG. 2, physical verification system 204 can compare the number of queued commands 208 to a target number. The target number can be determined based on the overhead cost needed to add additional computing resources, such as a new host, to computing resources 212. Physical verification system 204 can add the additional computing resources when the number of queued commands 208 is greater than the target number for a specific period of time (e.g., 30 minutes). In addition, physical verification system 204 can determine the target number based on inputs including an estimated time to complete queued commands 208, the improved execution of queued commands 208 by threading, an estimated time to complete the longest command chain in queued commands 208, and other information of queued commands 208. Physical verification system 204 can determine the estimated time to complete queued commands 208 based on the information of the commands in queued commands 208, for example, the length of each command in queued commands 208 and the number of input layers for each command in queued commands 208. The length of a command can be a number of commands in the longest command chain for the command. For example, as shown in FIG. 1, command C6 depends on a first command chain of commands C9 and C11 and a second command chain of commands C7, C10, and C11. The length of command C6 can be three commands of C7, C10, and C11 in the second command chain. The input layers can be the physical layout layers that a command operates on, such as LAYER1 and LAYER2 for command C1. As discussed above, Command C5 can have six input layers of LAYER1-LAYER6 while command C1 can have two input layers of LAYER1 and LAYER2. The information of these inputs can improve the accuracy of the target number.

In some embodiments, the parameters for physical verification system 204 to acquire additional computing resources 212 can include an actual amount of computing resources 212 used for the physical verification job and an estimated amount of computing resources 212 for queued commands 208. Physical verification system can obtain the actual amount of computing resources 212 for the executed commands of the physical verification job. Machine-learning models in physical verification system 204 can obtain the actual amount of computing resources 212 used for the executed commands. Based on the actual amount of computing resources 212 and the related information of queued commands 208, physical verification system 204 can determine the estimated amount of computing resources 212 for queued commands 208 and the estimated time to complete queued commands 208. In some embodiments, the related information of queued commands 208 can include the length of each command in queued commands 208 and the number of input layers for each command in queued commands 208. In some embodiments, physical verification system 204 can compare the length and the number of input layers of each command in queued commands 208 with the length and the number of input layers of executed commands. Physical verification system 204 can determine the estimated amount of computing resources 212 based on the actual amount of computer resources 212 used for the executed commands. In some embodiments, physical verification system 204 can build a machine-learning model based on the length of executed commands, the number of input layers of executed commands, and the actual amount of computer resources 212 used for the executed commands. Physical verification system 204 can determine the estimated amount of computing resources 212 for queued commands 208 using the machine-learning model. Additional computing resources 212 can be requested according to the estimated amount.

In some embodiments, the parameters for physical verification system 204 to acquire additional computing resources 212 can include the amount of computing resources, such as the number of hosts and CPUs, that one of acquisition commands 209 acquires. In some embodiments, one of acquisition commands 209 can acquire a single host having multiple CPUs. In some embodiments, one of acquisition commands 209 can acquire multiple hosts. With the detailed information of acquisition commands 209, physical verification system 204 can generate a number of acquisition commands 209 to acquire the additional computing resources. In some embodiments, physical verification system 204 can determine the number of CPUs and the number of hosts in one of acquisition commands 209 based on the impact of the computing resources by one of acquisition commands 209 on queued commands 208.

In some embodiments, the parameters for physical verification system 204 to acquire additional computing resources 212 can include an estimated time to complete the physical verification job. Adding and removing additional computing resources, such as a host, can have an overhead cost. The more time needed to complete the physical verification job, the more time the additional computing resources can be used for the physical verification job, and the better the overhead cost can be justified. Accordingly, additional computing resources 212 can be acquired in response to the estimated time to complete the physical verification job being greater than a target time. In some embodiments, physical verification system 204 can add or remove hots in computing resources 212 to minimize overhead cost and the runtime to complete the physical verification job.

In some embodiments, the parameters for physical verification system 204 to acquire additional computing resources 212 can include an actual amount of memory used by the executed commands and an estimated amount of memory for queued commands 208. In some embodiments, additional memory may be needed to satisfy the memory requirements of queued commands 208. Physical verification system 204 can determine the actual amount of memory used by the physical verification job, the amount of available memory on computing resources 212, and an estimated amount of memory for queued commands 208. In some embodiments, the number of queued commands 208 can be less than the target number to add additional computing resources, but the estimated amount of memory for queued commands 208 can be greater than a sum of the actual amount of memory and the amount of available memory. Additional computing resources such as hosts can be acquired for queued commands 208.

In some embodiments, the parameters for physical verification system 204 to acquire additional computing resources 212 can include a type of the additional computing resources, including cloud and local computing resources. For example, local computing resources may be specified to acquire before cloud computing resources to reduce the cost of the physical verification job. In some embodiments, physical verification system 204 can obtain information of queued commands 208. The information of queued commands 208 can include a length of a command chain in queued commands 208, dependencies of queued commands 208, and other related information. In some embodiments, queued commands 208 can be executed and completed. After the execution of queued commands 208, additional commands depending on the executed commands can be added to queued commands 208. In some embodiments, physical verification system 204 can determine the types of the additional computing resources required for queued commands 208.

In some embodiments, physical verification system 204 can include the parameters as described above in a cost function and a machine learning model to determine the estimated amount of additional computing resources for queued commands 208. In some embodiments, physical verification system 204 can re-evaluate the estimated amount of additional computing resources 212 when additional commands are added to the queue. In some embodiments, physical verification system 204 can request additional computing resources 212 in real-time during the execution of the physical verification job and can monitor the arrival of additional computing resources 212. In some embodiments, physical verification system 204 can acquire additional computing resources 212 multiple times during the physical verification job.

In some embodiments, based on the system executing the physical verification job, physical verification system 204 can determine the mechanism to acquire additional computing resources 212 and generate corresponding acquisition commands 209. For example, physical verification system 204 can generate corresponding acquisition commands 209 for an LSF or an SGE batch queueing system. Example acquisition commands 209 can request eight CPUs from the batch queueing system, define where the output and error messages are written, and provide an appropriate physical verification system command that allows physical verification system 204 to correctly interpret the acquired computing resources 212.

Referring to FIG. 3, at 350, a portion of the estimated amount of computing resources are released in response to the portion of the estimated amount of computing resources being idle for an amount of time greater than a target time. For example, as shown in FIGS. 1 and 2, a portion of computing resources 212 can be released if the portion of computing resources 212 are idle for an amount greater than a target time (e.g., about 30 minutes).

In some embodiments, scheduler 206 of physical verification system 204 can keep track of computing resources 212 executing the commands. In some embodiments, an individual command can hold up its dependent commands and the number of queued commands 208 can be zero. The individual command may be executed on one host and other hosts of the allocated computing resources 212 can be idle and underutilized. An underutilized CPU is a CPU on a host that is not executing any command or providing any threading to a command. If all the CPUs of a host are underutilized, the host is not executing any command and can be referred to as idle. In some embodiments, an idle host can be removed from the physical verification job. Removing the idle host can release the licenses used by the physical verification job and can release computing resources 212 for other users. In a cloud computing system, removing the idle host can stop the charge of the idle host and reduce cost of the physical verification job.

In some embodiments, the idle host and underutilized CPU may be assigned additional commands when the additional commands are added to queued commands 208. As a result, idle computing resources 212 may not be released immediately when computing resources 212 become idle. In some embodiments, idle computing resources 212 can be released based on an amount of time for computing resources 212 being idle, an estimated number of commands to be added to queued commands 208 in a specific period of time, and other information of the process of the physical verification job. Scheduler 206 of physical verification system 204 can determine the estimated number of commands to be added to queued commands 208 based on the dependency graph (e.g., dependency graph 100) of the commands.

In some embodiments, the user may not need to inform physical verification system 204 how to remove a host. Physical verification system 204 can stop execution of all the commands on the idle host, including parent and child commands. For example, in a batch queuing system, stopping execution of the parent commands can release the host. In some embodiments, reservation system 210 of physical verification system 204 can keep track of acquired computing resources 212. Physical verification system 204 can release a portion of the acquired or reserved computing resources 212 and can modify the reservation information of acquired computing resources 212. In some embodiments, physical verification system 204 can identify hosts that have underutilized CPUs but are not completely idle. Such hosts can be referred to as underutilized hosts. Physical verification system 204 can stop assigning commands to the underutilized hosts. In some embodiments, physical verification system 204 can re-assign executing commands on the underutilized hosts to another host to optimize utilization of computing resources 212.

In some embodiments, physical verification system 204 can start the physical verification job with an initial amount of computing resources 212 specified in the launch instructions. During execution of the physical verification job, physical verification system 204 can determine whether the physical verification job needs additional computing resources based on parameters such as the number of queued commands 208, related information of queued commands 208, the estimated amount of computing resources for queued commands 208, and other parameters. Physical verification system 204 can automatically add the additional computing resources to computing resources 212 to reduce the runtime of the physical verification job. In some embodiments, physical verification system 204 can release a portion of computing resources 212 based on an amount of time for the portion of computing resources 212 being idle, an estimated number of commands to be executed in a specific period time, and other information of the process of the physical verification job. Physical verification system 204 can automatically remove the portion of idle computing resources 212. In some embodiments, the amount of the computing resources 212 executing the commands can change during the process of the physical verification job. For example, more computing resources 212 can be used when the executing commands have intense computations. Fewer computing resources 212 can be used when the executing commands include a long command chain.

In some embodiments, physical verification system 204 can provide automatic elastic CPU for the physical verification job. The automatic elastic CPU can automatically add and remove computing resources for the physical verification job. The automatic elastic CPU can reduce the runtime of the physical verification job. Instead of allocating a large amount of computing resources 212 by the user to the physical verification job, physical verification system 204 can automatically add and release computing resources during the physical verification job. As a result, the runtime of the physical verification job can be reduced and the cost of computing resources 212 for the physical verification job can be reduced.

Figure 4:
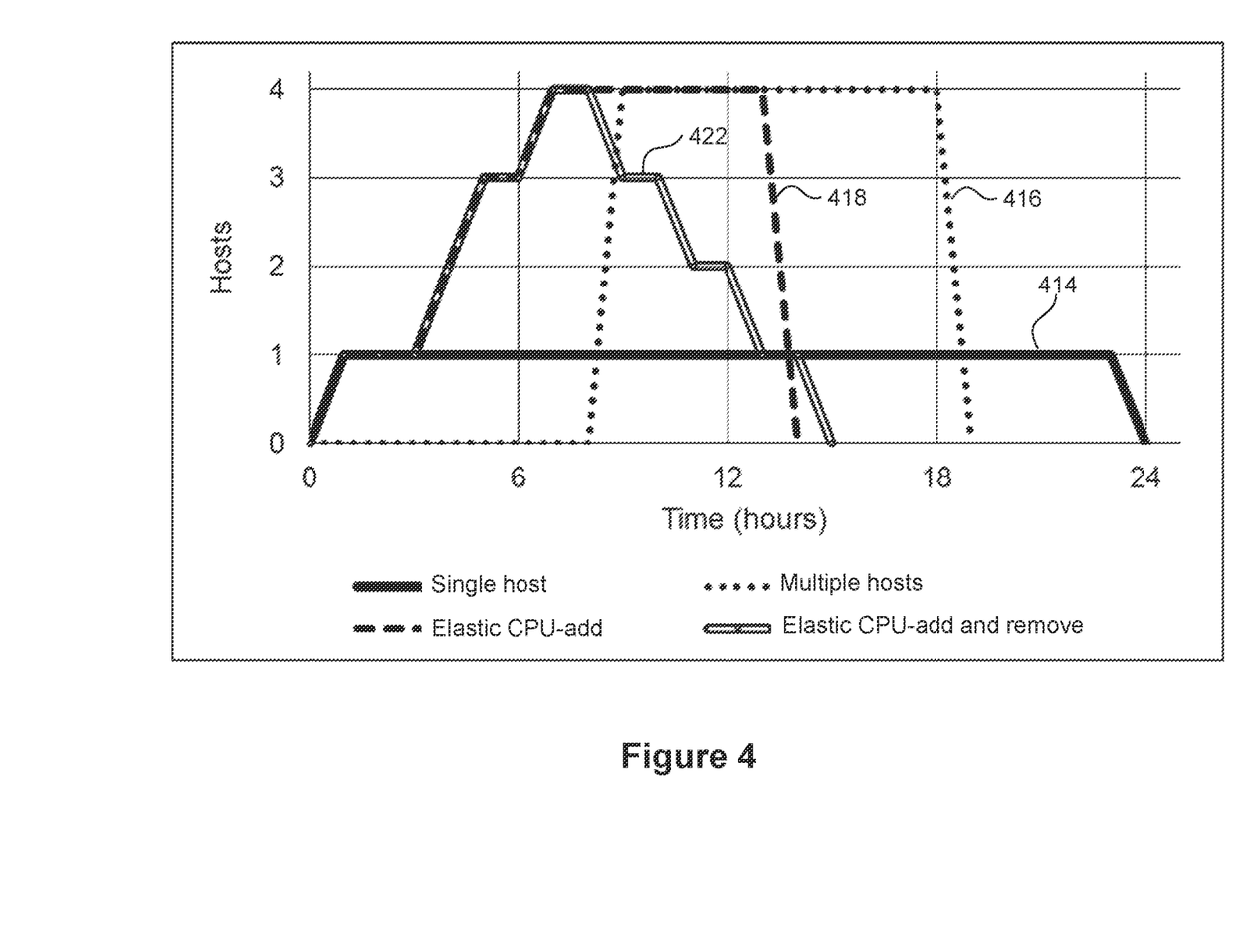
FIG. 4 illustrates results for physical verification of a design performed in four configurations with design and runset fixed, according to some embodiments of the present disclosure.

FIG. 4 illustrates results for physical verification of a design performed in four configurations with design and runset fixed, according to some embodiments of the present disclosure. As shown in FIG. 4, the physical verification job of the design can be performed in four configurations: single host, multiple hosts, elastic CPU-add, and elastic CPU-add and remove, corresponding to profiles 414, 416, 418, and 422 respectively. In some embodiments, X-axis in FIG. 4 can represent the runtime of the physical verification job, and Y-axis in FIG. 4 can represent hosts assigned for the physical verification job at certain period of time. As shown in FIG. 4, different configurations can complete the physical verification job in different times with different amount of computing resources. In some embodiments, the computing resources can include a number of hosts and a number of licenses for the physical verification job. Referring to FIG. 4, the hosts for the physical verification job can change as a function of time in profiles 414, 416, 418, and 422. In some embodiments, the resource utilization of each configuration can be represented by an area under the curves of profiles 414, 416, 418, and 422 in FIG. 4. The resource utilization can be determined based on the computing resources (e.g., hosts) used for a period of time. The resource utilization can represent the total cost of the physical verification job. The larger the area is under the curves of profiles 414, 416, 418, and 422, the higher the cost is for the corresponding configuration to perform the physical verification job. In some embodiments, FIG. 4 can illustrate the runtime and resource utilization for each of the four configurations of the physical verification tool.

Referring to FIG. 4, profile 414 illustrates that the physical verification job with a single host can be easier to launch. Physical verification system 204 can easily acquire a single host available at the beginning of the physical verification job. However, the turn-around time of the physical verification job with a single host can be longer, for example, about twenty-four hours shown in FIG. 4. The turn-around time can be a period of time used by the computing resources to complete the physical verification job.

Referring to FIG. 4, profile 416 illustrates that physical verification job with multiple hosts can be harder to launch than other configurations. Physical verification system 204 may need all the requested hosts available at the same time to start performing the physical verification job. All the hosts may have a lower probability to be available at the same time. It may take a longer waiting time to add the multiple hosts, for example, about eight hours shown in FIG. 4. The turn-around time of the physical verification job with multiple hosts can be better than other configurations. However, the physical verification job with multiple hosts can take a longer waiting time and some of the hosts may be idle during the process of the physical verification job. The runtime of the physical verification job can include both the waiting time and the turn-around time. Therefore, the runtime of the physical verification job with multiple hosts can be longer than some of the other configurations.

Referring to FIG. 4, profile 418 illustrates that the physical verification job with elastic CPU-add can add additional computing resources but may not remove computing resources during the process of the physical verification job. The turn-around time of the physical verification job with elastic CPU-add in profile 418 can be comparable to that of profile 416. The waiting time for the physical verification job with elastic CPU-add can be reduced to about zero, as physical verification system 204 can acquire one host at the beginning and add additional hosts when they are available during the process of the physical verification job. The resource utilization for the configuration of elastic CPU-add in profile 418 can be comparable to profile 416 but can be higher than profile 414. With the configuration of elastic CPU-add, physical verification system 204 may not use all the CPUs of the hosts. Some of the hosts may be idle during the process of the physical verification job.

Referring to FIG. 4, profile 422 illustrates that the turn-around time of the physical verification job with elastic CPU-add and remove can be comparable to the turn-around times of profiles 416 and 418. The waiting time of in profile 422 can be reduced to about zero. In addition, the resource utilization in profile 422 can be reduced, as physical verification system 204 can remove idle hosts during the process of the physical verification job. As shown in profile 422 of FIG. 4, physical verification system 204 can remove one host at about eight hours, one host at about ten hours, one host at about twelve hours, and one host at about fourteen hours. When a host is idle for an amount of time greater than a target time, physical verification system 204 can remove the host to reduce the cost of the computing resources and improve the resource utilization.

In some embodiments, according to FIG. 4, the resource utilization of the configuration of elastic CPU with adding and removing hosts in profile 422 can be less than other configurations in profiles 414, 416, and 418. The turn-around time in profile 422 can be comparable to profile 418. In some embodiments, though the turn-around time of the physical verification job may not be significantly reduced by the configuration of elastic CPU with adding and removing hosts in profile 422, the resource utilization and the cost of the computing resources can be reduced. In addition, requesting a large number of computing resources (e.g., 4 hosts for the configuration of multiple hosts shown in profile 414 of FIG. 4) can increase the waiting time for the physical verification job, and the runtime for the physical verification job can increase. The configuration of elastic CPU with adding and removing hosts can start with a small number of computing resources (e.g., one host shown in FIG. 4), automatically add additional computing resources when needed, and automatically remove idle computing resources. As a result, the configuration of elastic CPU with automatic adding and removing hosts can reduce the runtime and resource utilization for the physical verification job.

Figure 5:
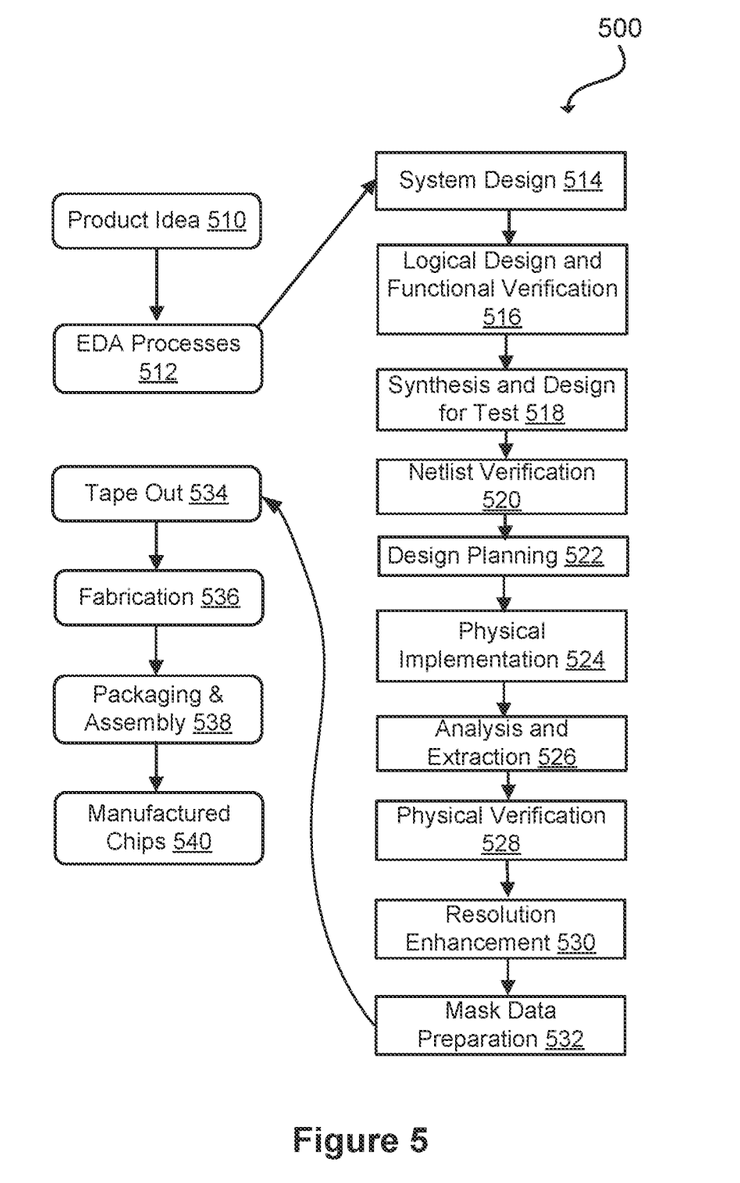
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce manufactured chips 540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    generating a plurality of commands for a physical verification job of a design, wherein the plurality of commands is related by a dependency graph;
    allocating an initial amount of computing resources to execute the plurality of commands;
    queuing a subset of the plurality of commands for execution based on the dependency graph;
    adding, by a processor, an estimated amount of computing resources to the initial amount of computing resources based on the number of the queued subset of commands and an estimated time to complete the queued subset of commands, wherein the estimated time is determined according to one or more of a length of a command chain for each command and a number of input layers that each command operates on in the queued subset of commands; and
    releasing a portion of the estimated amount of computing resources in response to the portion of the estimated amount of computing resources being idle for an amount of time greater than a target time.

2. The method of claim 1, further comprising:
    determining an actual amount of computing resources to execute at least one command; and
    determining the estimated amount of computing resources based on the actual amount of computing resources.

3. The method of claim 1, further comprising:
    queuing additional commands that depend on the queued subset of commands after execution of the queued subset of commands.

4. The method of claim 1, further comprising:
    generating, based on a batch queueing system executing the queued subset of commands, an acquisition command to acquire the estimated amount of computing resources.

5. The method of claim 1, further comprising:
    generating a number of acquisition commands to acquire the estimated amount of computing resources, wherein each acquisition command acquires a specific number of computing resources.

6. The method of claim 1, further comprising:
    determining the estimated amount of computing resources using a cost function and a machine learning model.

7. The method of claim 1, further comprising:
    adding additional computing resources to the estimated amount of computing resources in response to an amount of available memory on the initial amount of computing resources being less than an estimated amount of memory for the number of queued subset of commands.

8. The method of claim 1, wherein adding the estimated amount of computing resources comprises:
    adding the estimated amount of computing resources in response to the number of queued subset of commands being greater than a target number for a period of time.

9. A system, comprising:
    a memory storing instructions; and
    at least one processor coupled with the memory to execute the instructions, the instructions when executed cause the processor to:
        generate a plurality of commands for a physical verification job of a design, wherein the plurality of commands are related by a dependency graph;
        allocate an initial amount of computing resources to execute the plurality of commands;
        queue a subset of the plurality of commands for execution based on the dependency graph;
        add an estimated amount of computing resources to the initial amount based on the number of the queued subset of commands and an estimated time to complete the queued subset of commands, wherein the estimated time is determined according to one or more of a length of a command chain for each command and a number of input layers that each command operates on in the queued subset of commands; and
        release a portion of the estimated amount of computing resources in response to the portion of the estimated amount of computing resources being idle for an amount of time greater than a target time.

10. The system of claim 9, wherein the processor further:
    determines an actual amount of computing resources to execute at least one command; and
    determines the estimated amount of computing resources based on the actual amount of computing resources.

11. The system of claim 9, wherein the processor further:
    queues additional commands that depends on the queued subset of commands after execution of the queued subset of commands.

12. The system of claim 9, wherein the processor further:
    generates, based on a batch queueing system executing the queued subset of commands, an acquisition command to acquire the estimated amount of computing resources.

13. The system of claim 9, wherein the processor further:
determines the estimated amount of the estimated amount of computing resources using a cost function and a machine learning model.

14. The system of claim 9, wherein the processor further:
adds additional computing resources to the estimated amount of computing resources in response to an amount of available memory on the initial amount of computing resources being less than an estimated amount of memory for the number of queued subset of commands.

15. The system of claim 9, wherein adding the estimated amount of computing resources comprises:
adding the estimated amount of computing resources in response to the number of queued subset of commands being greater than a target number for a period of time.

16. A non-transitory computer-readable storage medium storing instructions that, when executed by at least one processor, cause the at least one processor to:
generate a plurality of commands for a physical verification job of a design, wherein the plurality of commands are related by a dependency graph;
allocate an initial amount of computing resources to execute the plurality of commands;
queue a subset of the plurality of commands for execution based on the dependency graph;
add an estimated amount of computing resources to the initial amount based on the number of the queued subset of commands and an estimated time to complete the queued subset of commands, wherein the estimated time is determined according to one or more of a length of a command chain for each command and a number of input layers that each command operates on in the queued subset of commands; and
release a portion of the estimated amount of computing resources in response to the portion of the estimated amount of computing resources being idle for an amount of time greater than a target time.

17. The non-transitory computer-readable storage medium of claim 16, wherein the processor further:
determines an actual amount of computing resources to execute at least one command; and
determines the estimated amount of computing resources based on the actual amount of computing resources.

18. The non-transitory computer-readable storage medium of claim 16, wherein the processor further:
queues additional commands that depends on the queued subset of commands after execution of the queued subset of commands.

19. The non-transitory computer-readable storage medium of claim 16, wherein the processor further:
generates, based on a batch queueing system executing the queued subset of commands, an acquisition command to acquire the estimated amount of computing resources.

20. The non-transitory computer-readable storage medium of claim 16, wherein the processor further:
adds additional computing resources to the estimated amount of computing resources in response to an amount of available memory on the initial amount of computing resources being less than an estimated amount of memory for the number of queued subset of commands.

\* \* \* \* \*